United States Patent
Choi

(10) Patent No.: US 7,553,729 B2
(45) Date of Patent: Jun. 30, 2009

(54) METHOD OF MANUFACTURING NON-VOLATILE MEMORY DEVICE

(75) Inventor: Won Yeol Choi, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 378 days.

(21) Appl. No.: 11/646,728

(22) Filed: Dec. 28, 2006

(65) Prior Publication Data
US 2007/0275519 A1 Nov. 29, 2007

(30) Foreign Application Priority Data
May 26, 2006 (KR) .................. 10-2006-0047684
Dec. 20, 2006 (KR) .................. 10-2006-0131118

(51) Int. Cl.
*H01L 21/336* (2006.01)
(52) U.S. Cl. .............. 438/266; 438/201; 438/257; 438/287; 438/581; 438/583; 438/630; 438/655; 257/316; 257/E21.199; 257/E21.2
(58) Field of Classification Search ............. 438/201, 438/266, 257, 287, 581, 583, 630, 655; 257/316, 257/E21.199, E21.2
See application file for complete search history.

(56) References Cited
U.S. PATENT DOCUMENTS
6,140,688 A * 10/2000 Gardner et al. .............. 257/412
6,210,999 B1 * 4/2001 Gardner et al. .............. 438/183
6,867,101 B1 * 3/2005 Yu .............. 438/287
2004/0126972 A1 * 7/2004 Dong et al. .............. 438/259
2004/0248366 A1 * 12/2004 Kwak .............. 438/257
2005/0142765 A1 * 6/2005 Joo .............. 438/264
2005/0151184 A1 * 7/2005 Lee et al. .............. 257/314
2005/0161729 A1 * 7/2005 Dong et al. .............. 257/315

FOREIGN PATENT DOCUMENTS

| KR | 10-2002-0001253 | 1/2002 |
|---|---|---|
| KR | 10-2002-007861 | 1/2002 |
| KR | 10-2004-0002301 | 1/2004 |
| KR | 10-2005-041433 | 5/2005 |
| KR | 10-2005-0073050 | 7/2005 |
| KR | 10-2006-0028765 | 4/2006 |

* cited by examiner

*Primary Examiner*—Thanh V Pham
(74) *Attorney, Agent, or Firm*—Marshall, Gerstein & Borun LLP

(57) ABSTRACT

A method of manufacturing a non-volatile memory device includes the steps of forming gates respectively having a structure in which a gate insulating layer, a first conductive layer, a dielectric layer, a second conductive layer and a metal-silicide layer are laminated over a semiconductor substrate, annealing the metal-silicide layer at a temperature, which is the same as or lower than an annealing temperature of the dielectric layer, forming a buffer oxide layer on the entire surface, and forming a nitride layer on the buffer oxide layer.

11 Claims, 4 Drawing Sheets

METAL-SILICIDE LAYER ANNEALING

METHOD OF MANUFACTURING NON-VOLATILE MEMORY DEVICE

CROSS-REFERENCES TO RELATED APPLICATIONS

The present application claims priority to Korean patent application number 10-2006-47684 filed on May 26, 2006 and Korean patent application number 10-2006-131118 filed on Dec. 20, 2006, which are incorporated by reference in its entirety.

BACKGROUND OF THE INVENTION

The present invention relates to a method of manufacturing a non-volatile memory device.

In general, as the size of a flash memory device shrinks, a program disturb characteristic of a non-volatile memory device becomes close relation with other processes. The most possible reason of the program disturb phenomenon lies in fail on the substrate due to thermal stress in terms of process. Error can be improved through healing at higher temperature in a subsequent thermal treatment process of the NAND flash memory manufacture process employing Self-Aligned Contact (SAC).

If the conventional method is used without change, however, the program disturb problem may occur in line with the miniaturization of devices.

SUMMARY OF THE INVENTION

Accordingly, the present invention addresses the above problems, and provides a method of manufacturing a non-volatile memory device, in which error occurring in a semiconductor substrate can be prohibited and a program disturb characteristic can be improved by presenting a condition for forming a nitride layer used in the SAC process causing physical stress when the non-volatile memory device is formed, and optimizing a thermal treatment process of a tungsten silicide layer, that is, a nucleus of a gate process.

According to an aspect of the present invention, a method of manufacturing a non-volatile memory device includes the steps of forming gates respectively having a structure in which a gate insulating layer, a first conductive layer, a dielectric layer, a second conductive layer and a metal-silicide layer are laminated over a semiconductor substrate, annealing the metal-silicide layer at a temperature, which is the same as or lower than an annealing temperature of the dielectric layer, forming a buffer oxide layer on the entire surface, and forming a nitride layer on the buffer oxide layer.

DETAILED DESCRIPTION OF EMBODIMENTS

Now, specific embodiments according to the present patent will be described with reference to the accompanying drawings.

FIGS. 1A to 1E are cross-sectional views illustrating a method of manufacturing a non-volatile memory device according to an embodiment of the present invention.

Figure 1A:
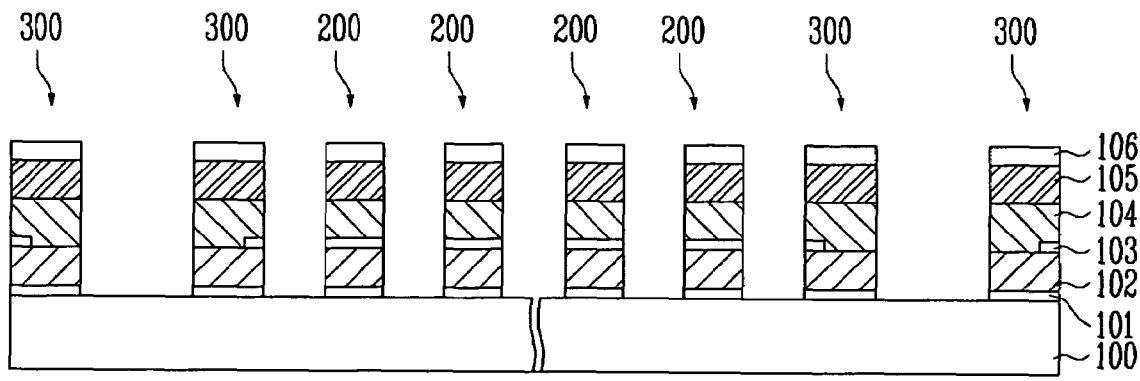
FIGS. 1A to 1E are cross-sectional views illustrating a method of manufacturing a non-volatile memory device according to an embodiment of the present invention.

Referring to FIG. 1A, gates 200 and 300 are formed on a semiconductor substrate 100. The gates 200 and 300 include gates for high voltage and low voltage, of peripheral circuits (not shown), as well as gates 200 for cells and gates 300 for select transistors.

Before the gates 200 and 300 are formed, a well formation process, a trench type isolation structure formation process and so on are performed. The isolation structure can be formed by a Shallow Trench Isolation (STI) scheme or an SA-STI scheme.

Each of the gates 200 includes a gate insulating layer 101, a first conductive layer 102, a dielectric layer 103, a second conductive layer 104, a metal-silicide layer 105 and a gate hard mask layer 106 all of which are laminated over the semiconductor substrate 100.

In the gate for the cell 200, the first conductive layer 102 serves as a floating gate, and the second conductive layer 104 and the metal-silicide layer 105 serve as a control gate. In the gate for the select transistor 300, the first conductive layer 103, the second conductive layer 104 and the metal-silicide layer 105 are connected and serve as gates.

The dielectric layer 103 has an oxide-nitride-oxide (ONO) structure. In order to improve the film quality of the dielectric layer 103, the dielectric layer 103 can be annealed in a temperature range of 800 to 850 degrees Celsius. The metal-silicide layer 105 can be formed of a tungsten-silicide layer.

Figure 1B:
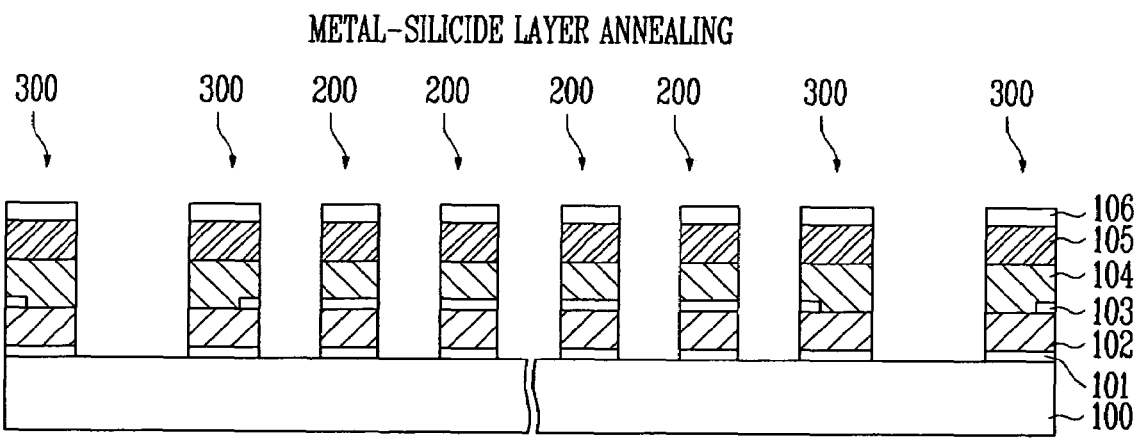

Referring to FIG. 1B, the metal-silicide layer 105 is annealed in order to solve a word line loading problem occurring due to a high resistivity of the gate. The annealing process of the metal-silicide layer 105 can be performed at a temperature, which is the same as or lower than that of the annealing temperature of the ONO dielectric layer 103. The reason is described later on with reference to FIG. 3. The annealing process when the metal-silicide layer 105 is the tungsten-silicide layer is described below with reference to FIG. 2.

Figure 2:
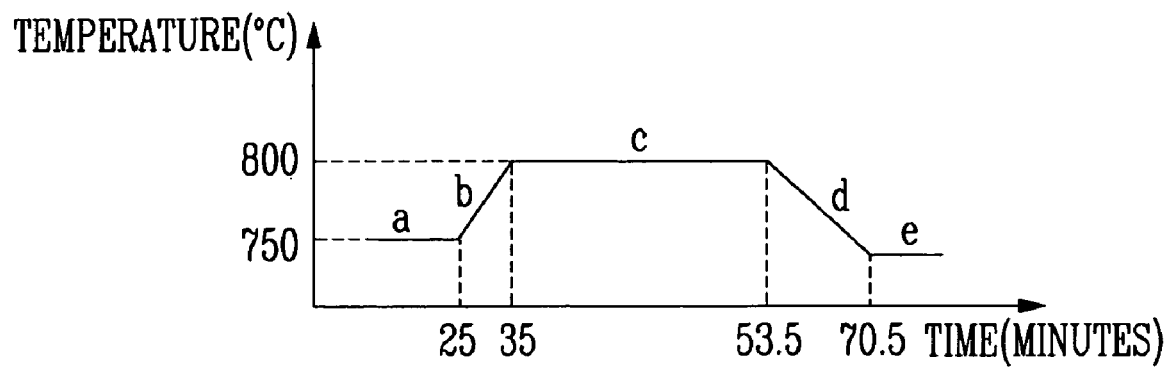
FIG. 2 is a graph illustrating an annealing process of a tungsten-silicide layer shown in FIG. 1B.

FIG. 2 is a graph illustrating the annealing process of the tungsten-silicide layer shown in FIG. 1B.

The annealing process of the tungsten-silicide layer 105 is carried out under $N_2$ atmosphere, and includes a loading step A, a ramp-up step B, an annealing holding step C, a ramp-down step D and a unloading step E.

The loading step A is performed at a temperature of 750 degrees Celsius for 25 minutes. The ramp-up step B is performed for 10 minutes while raising the temperature from 750 degrees Celsius to 800 degrees Celsius. The annealing holding step C is a step of maintaining a main annealing temperature, and is performed at a temperature of 800 degrees Celsius for 18.5 minutes. The ramp-down step D is performed for 17 minutes while lowering the temperature from 800 degrees Celsius to 750 degrees Celsius. The unloading step E is performed for 30 minutes at a temperature of 750 degrees Celsius.

It is to be noted that the temperature and time used in the annealing process of the tungsten-silicide layer are only illustrative experimental data. Accordingly, the present invention is not limited to the above temperature and time set in the experimental data, but may include varying temperature and time.

Figure 3:
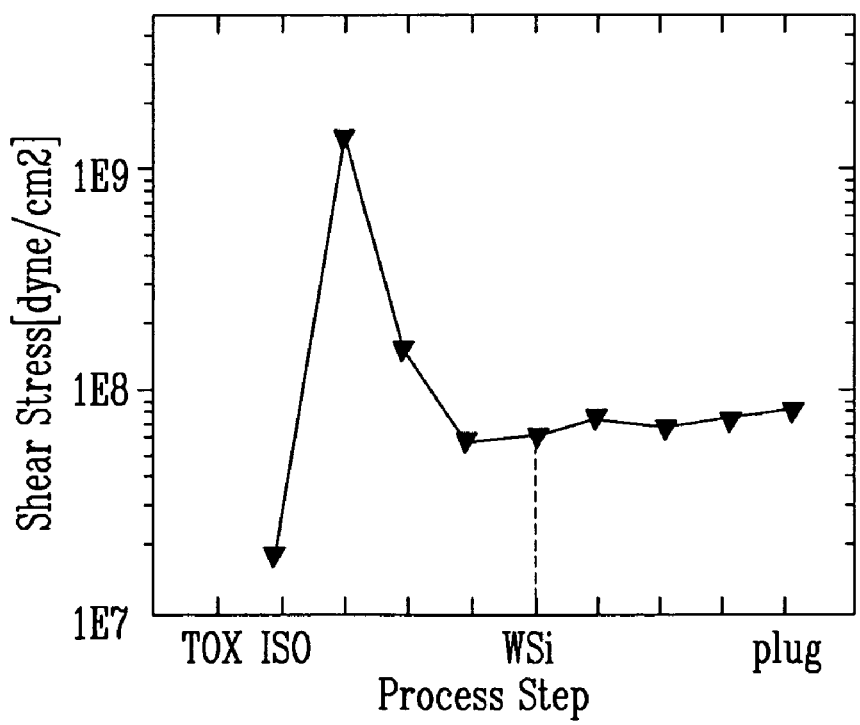
FIG. 3 is a graph illustrating stress on an element-formation-step basis.

FIG. 3 is a graph illustrating stress on an element-formation-step basis. In general, the annealing temperature of the ONO dielectric layer 103 ranges from 800 to 850 degrees Celsius. If the annealing temperature of the tungsten-silicide layer 105 is higher than 850 degrees Celsius, stress increases at the top corner of a trench type isolation structure. However, if the annealing process is performed under the condition presented by the present invention, stress maintains a very stable value as shown in FIG. 3.

Figure 1C:
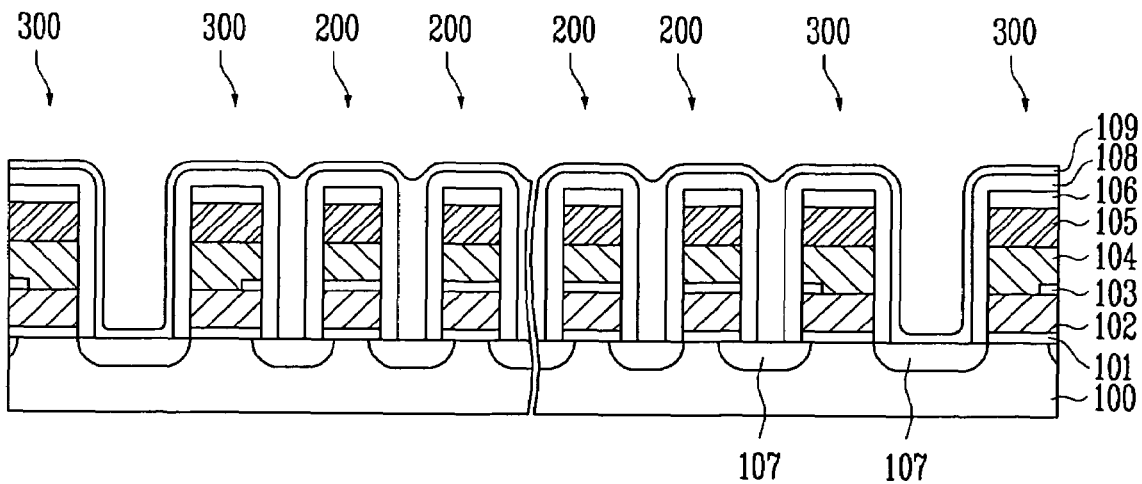

Referring to FIG. 1C, after the metal-silicide layer 105 is annealed, an impurity ion implant region 107, a gate spacer insulating layer 108, and an SAC buffer oxide layer 109 are formed over the semiconductor substrate 100.

The SAC buffer oxide layer 109 can be formed by a deposition process in a temperature range of 650 to 700 degrees Celsius.

Figure 1D:
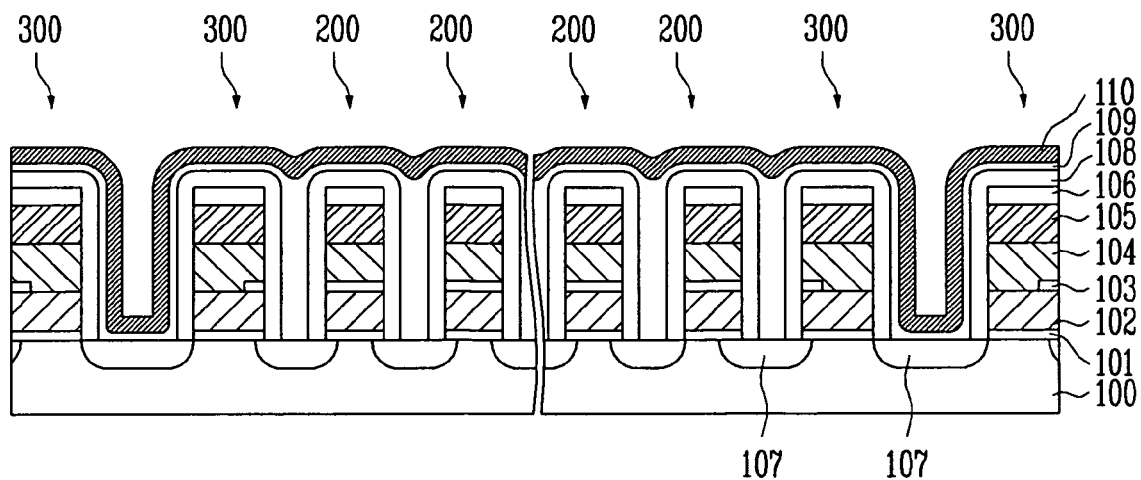

Referring to FIG. 1D, an SAC nitride layer 110 is formed on the SAC buffer oxide layer 109. The SAC nitride layer 110 can be formed by a Plasma Enhanced Chemical Vapor Deposition (PE-CVD) method or a Low Pressure CVD (LP-CVD) method. However, stress is greater when the SAC nitride layer 110 is formed by the LP-CVD method than when the SAC nitride layer 110 is formed by the PE-CVD method. Thus, the number of fail bits is three times greater when the SAC nitride layer 110 is formed by the LP-CVD method than when the SAC nitride layer 110 is formed by the PE-CVD method. This is described later on with reference to FIG. 5. The formation process of the SAC nitride layer 110 is described below with reference to FIG. 4.

Figure 4:
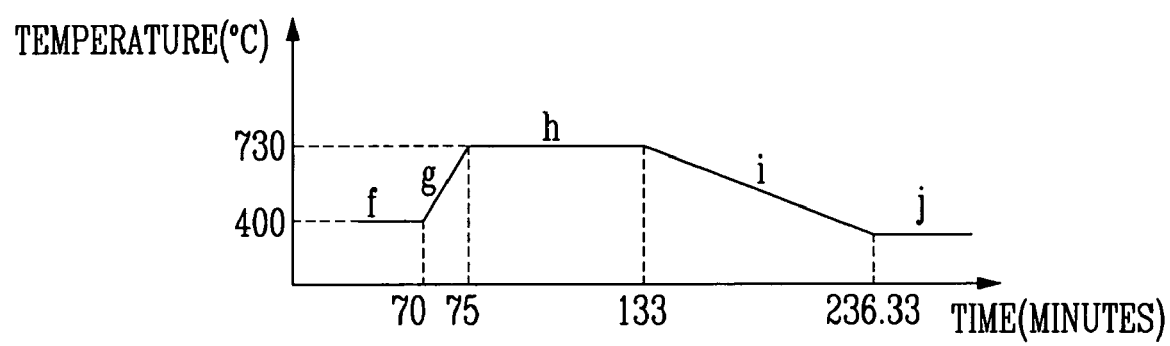
FIG. 4 is a graph illustrating a formation process of an SAC nitride layer shown in FIG. 1D.

FIG. 4 is a graph illustrating the formation process of the SAC nitride layer 110 shown in FIG. 1D.

The SAC nitride layer 110 is formed by a PE-CVD method, and includes a loading step F, a ramp-up step G, a deposition step H, a ramp-down step I, and an unloading step J.

The loading step F is kept to atmospheric pressure under $N_2$ atmosphere, and is performed at a temperature of 400 degrees Celsius for 70 minutes.

In the ramp-up step G, the pressure is kept to 5 Torr under $N_2$ atmosphere, and the temperature is raised every 5 degrees Celsius per minute and is dropped to 730 degrees Celsius for 66 minutes.

The deposition step H is kept to 0.35 Torr under atmosphere in which $N_2$, $NH_3$, and DCS($SiH_2Cl_2$) are mixed, and is performed at a temperature of 730 degrees Celsius for 57 minutes.

In the ramp-down step I, the pressure is kept to 0.35 Torr under $N_2$ atmosphere, and the temperature is lowered every 3 degrees Celsius per minute and is dropped to 400 degrees Celsius.

The unloading step J is performed at a temperature of 400 degrees Celsius for 120 minutes while slowly raising the pressure so that it becomes atmospheric pressure under $N_2$ atmosphere.

It is to be noted that the temperature, time and pressure used in the formation process of the SAC nitride layer 110 are only illustrative experimental data. Accordingly, the present invention is not limited to the above temperature, time and pressure set in the experimental data, but may include varying temperature, time and pressure.

Figure 5:
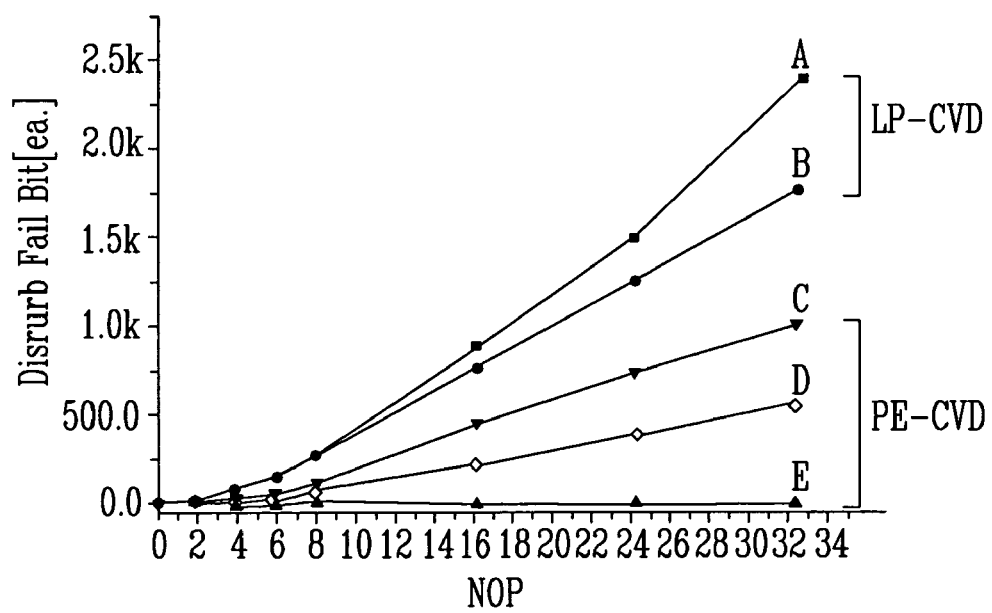
FIG. 5 is a graph illustrating fail bits depending on a deposition method of the SAC nitride layer.

FIG. 5 is a graph illustrating FAIL bits depending on the deposition method of the SAC nitride layer 110.

In the graph of FIG. 5, A and B indicate the number of fail bits when the SAC nitride layer 110 is formed by the LP-CVD method, and C, D and E indicate the number of fail bits when the SAC nitride layer 110 is formed by the PE-CVD method. It can be seen that the number of fail bits is less when the SAC nitride layer 110 is formed by the PE-CVD method than when the SAC nitride layer 110 is formed by the LP-CVD method. Accordingly, in the present invention, the SAC nitride layer 110 is formed by the PE-CVD method.

Further, a graph E indicates the formation process condition of the SAC nitride layer 110 described with reference to FIG. 4. It can be seen that the number of fail bits is less in the gray E than in the graphs A, B, C and D.

Figure 1E:
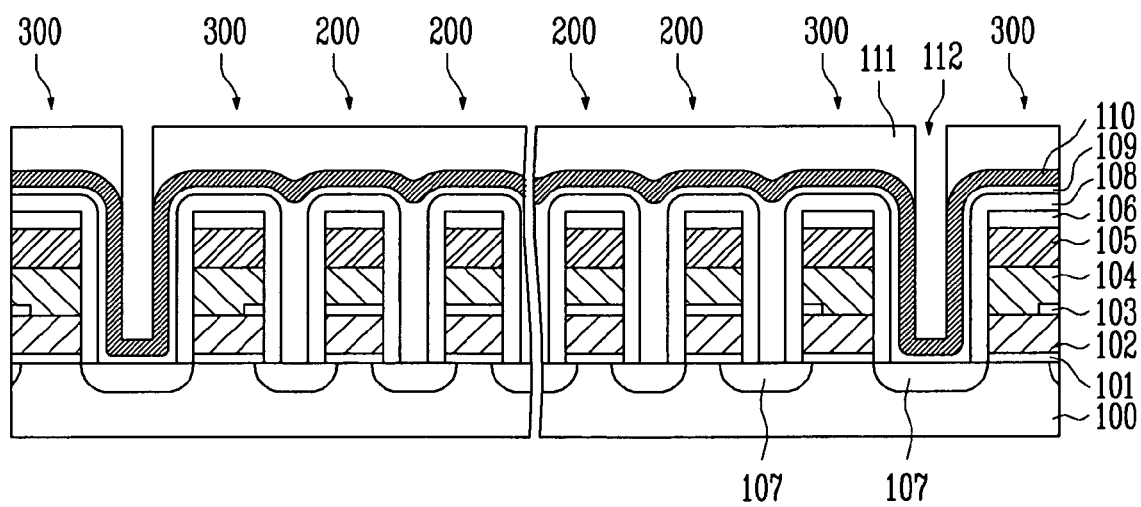

Referring to FIG. 1E, an insulating layer 111 is formed on the SAC nitride layer 110 in order to polish the surface. A contact hole 112 through which the impurity ion implant region 107 is exposed is formed by an SAC process.

As described above, according to the present invention, a condition for forming a nitride layer used in the SAC process, causing physical stress when a non-volatile memory device is formed, is presented, and a thermal treatment process of a tungsten silicide layer, that is, a nucleus of a gate process is optimized. Accordingly, error occurring in the semiconductor substrate can be prohibited and a program disturb characteristic can be improved.

Although the foregoing description has been made with reference to the various embodiments, it is to be understood that changes and modifications of the present patent may be made by the ordinary skilled in the art without departing from the spirit and scope of the present patent and appended claims.

What is claimed is:

1. A method of manufacturing a non-volatile memory device, comprising the steps of:
   forming gates respectively having a structure in which a gate insulating layer, a first conductive layer, a dielectric layer, a second conductive layer and a metal-silicide layer are laminated over a semiconductor substrate, the dielectric layer having a dielectric layer annealing temperature;
   annealing the metal-silicide layer at a temperature, which lower than the dielectric layer annealing temperature;
   forming a buffer oxide layer on the entire surface; and
   forming a nitride layer on the buffer oxide layer.

2. The method of claim 1, wherein the dielectric layer has an ONO lamination structure of an oxide layer, a nitride layer, and an oxide layer, and the dielectric layer annealing temperature thereof is in a range of 800 degrees Celsius to 850 degrees Celsius.

3. The method of claim 2, comprising annealing the metal-silicide layer at a temperature in the range of 750 degrees Celsius to less than 800 degrees Celsius.

4. The method of claim 1, wherein the metal-silicide layer includes a tungsten-silicide layer.

5. The method of claim 4, wherein the annealing process of the tungsten-silicide layer comprises:
   a loading step performed at a temperature of 750 degrees Celsius,
   a ramp-up step performed while raising the temperature from 750 degrees Celsius to 800 degrees Celsius,
   an annealing holding step performed at a temperature of 800 degrees Celsius,
   a ramp-down step performed while lowering the temperature from 800 degrees Celsius to 750 degrees Celsius, and
   an unloading step performed at a temperature of 750 degrees Celsius.

6. The method of claim 5, wherein the annealing process of the tungsten-silicide layer is performed under $N_2$ atmosphere.

7. The method of claim 1, further comprising the steps of, after the annealing process of the metal-silicide layer, forming an impurity ion implant region in the semiconductor substrate; and forming a gate spacer insulating layer.

8. The method of claim 1, wherein the nitride layer is formed by a Plasma Enhanced Chemical Vapor Deposition (PE-CVD) method.

9. The method of claim 1, wherein the nitride layer is formed in a temperature range of 400 to 730 degrees Celsius.

10. The method of claim 1, wherein the step of forming the nitride layer comprises:

a loading step performed at a temperature of 400 degrees Celsius with pressure being kept to atmospheric pressure under $N_2$ atmosphere, a ramp-up step of raising the temperature up to 730 degrees Celsius with the pressure being kept to 5 Torr under $N_2$ atmosphere, a deposition step performed at a temperature of 730 degrees Celsius with the pressure being kept to 0.35 Torr under a mixed atmosphere of $N_2$, $NH_3$, and DCS ($SiH_2Cl_2$), a ramp-down step of dropping the temperature down to 400 degrees Celsius with the pressure being kept to 0.35 Torr under $N_2$ atmosphere, and an unloading step performed at a temperature of 400 degrees Celsius while slowly raising the pressure up to atmospheric pressure under $N_2$ atmosphere.

11. The method of claim 10, wherein:

in the ramp-up step, the temperature is raised every 5 degrees Celsius per minute, and in the ramp-down step, the temperature is dropped every 3 degrees Celsius per minute.

* * * * *